United States Patent [19]

Endou et al.

[11] Patent Number: 4,560,589

[45] Date of Patent: Dec. 24, 1985

[54] METHOD FOR PROVIDING A COATING LAYER OF SILICON CARBIDE ON SUBSTRATE SURFACE

[75] Inventors: Morinobu Endou, Nagano; Minoru Takamizawa, Tokyo; Tatsuhiko Hongu, Kanagawa; Taishi Kobayashi, Niigata, all of Japan

[73] Assignee: Shin-Etsu Chemical Co., Ltd., Tokyo, Japan

[21] Appl. No.: 533,649

[22] Filed: Sep. 19, 1983

[30] Foreign Application Priority Data

Sep. 22, 1982 [JP] Japan ................................. 57-165498
Nov. 8, 1982 [JP] Japan ................................. 57-195702

[51] Int. Cl.[4] ........................ C23C 11/00; C23C 13/00
[52] U.S. Cl. ...................................... 427/249; 427/95; 427/255.1
[58] Field of Search ........... 427/95, 93, 249, DIG. 11, 427/255.1, 255.2, 399, 314, 255.4

[56] References Cited

U.S. PATENT DOCUMENTS

| | | | |
|---|---|---|---|
| 3,382,113 | 5/1968 | Ebert et al. | 427/249 |
| 3,386,866 | 6/1968 | Ebert et al. | 427/249 |
| 3,738,906 | 6/1973 | Olcott | 427/249 |
| 3,877,080 | 4/1975 | Olcott | 427/249 |
| 4,425,407 | 1/1984 | Galasso et al. | 427/249 |

FOREIGN PATENT DOCUMENTS 1021662  3/1966  United Kingdom ............... 427/249

*Primary Examiner*—Sadie L. Childs

[57] ABSTRACT

The invention provides a method for providing a highly protective coating layer of silicon carbide on to the surface of a substrate. The method comprises pyrolyzing the vapor of an organosilicon compound having at least one hydrogen atom directly bonded to the silicon atom in a molecule but having no halogen or oxygen atom directly bonded to the silicon atom at a temperature of 700° to 1400° C. in contact with the substrate surface to deposit silicon carbide thereon. In particular, the method is useful to form a sheath-and-core structure composed of the core of carbon filament and the coating layer of silicon carbide so that the carbon fibers are imparted with greatly improved resistance against oxidation and chemicals including molten metals when the carbon fibers are used as a reinforcing material of a fiber-reinforced metal composite as well as with improved affinity with molten resins and metals which is also an advantageous property as a reinforcing material for such matrix materials.

3 Claims, No Drawings

METHOD FOR PROVIDING A COATING LAYER OF SILICON CARBIDE ON SUBSTRATE SURFACE

BACKGROUND OF THE INVENTION

The present invention relates to a method for providing a coating layer of crystalline silicon carbide on the surface of a substrate, such as a ceramic plate used as a substrate in the preparation of various kinds of electronic devices. In particular, the invention relates to a method for the prepartion of a carbon fiber coated with siicon carbide to form a sheath-and-core structure.

As is well known, silicon carbide of high purity is a material having excellent properties such as high heat resistance, high resistance against oxidation or attack of chemicals, good heat conductivity and others. High-purity silicon carbide is also semiconductive electrically so that there are attempts in the field of electronics technology to provide a coating layer of silicon carbide on to the surface of various kinds of electronic materials including semiconductor substrates as well as jigs or other articles used in the processing of semiconductor devices by utilizing the above mentioned unique properties thereof. It is also desirable that various kinds of sealing materials and heat-conductive members are provided with a coating layer resistant to various influences from the environment as may be obtained by providing a coating layer of silicon carbide.

Turning now to carbon fibers manufactured by the infusibilization and carbonization of rayon, polyacrylonitrile and other organic fibers or filaments of lignin, pitch and other bituminous materials, they are widely used in various fields as a promising material with high mechanical strength and heat resistance although carbon fibers are unavoidably oxidized in an oxidizing atmosphere at high temperatures. For example, carbon fibers are used as a reinforcing material in various types of so-called composite materials with a synthetic resin or a metal as the matrix material. A problem in such an application of carbon fibers is the relatively poor wettability or affinity of the surface of carbon fibers with the molten resin or metal. Furthermore, certain metals react with carbon fibers at high temperatures to form a metal carbide so that the application of carbon fibers as a reinforcing material of fiber-reinforced metals is considerably limited.

Silicon carbide can also be obtained in a fibrous form free from the above mentioned problems of carbon fibers as a reinforcing material of synthetic resins and metals. That is, silicon carbide is highly resistant against oxidation and has a good wettability or affinity with molten resins and metals but has no reactivity with molten metals even at extremely high temperatures. Unfortunately, silicon carbide fibers are very expensive because they are manufactured in a very complicated process including preparation of a specific organosilicon polymer which is then spun into filaments followed by infusibilization and firing thereof into silicon carbide.

Accordingly, it would be an easy idea that the defects of the carbon fibers as a reinforcing material of composite materials may be overcome by providing a coating layer of silicon carbide on the surface of carbon fibers.

The prior art processes for providing a coating layer of silicon carbide on to the surface of a solid as a substrate are performed according to several different principles. For example, (1) silicon carbide is sublimated at an extremely high temperature of 2000° C. or above and the vapor of silicon carbide is deposited on the substrate surface to form a coating layer (see, for example, Japanese Patent Publication No. 41-9332), (2) a gaseous mixture of a chlorine-containing silane compound represented by the general formula $(CH_3)_aSiCl_{4-a}$, in which a is 0, 1, 2 or 3, and a hydrocarbon compound such as methane is pyrolyzed on the surface of the substrate heated at a high temperature to deposit silicon carbide formed in situ (see, for example, Japanese Patent Publication No. 44-18575), (3) a gaseous mixture of silane $SiH_4$ and a hydrocarbon compound is pyrolyzed on the substrate surface heated at a high temperature to deposit silicon carbide formed in situ (see, for example, British Pat. No. 1,039,748), and (4) a powdery mixture of silicon dioxide or elementary silicon and carbon is heated at 1500° C. or higher in contact with the substrate surface so that the silicon carbide is deposited on the substrate surface as it is formed by the reaction (see, for example, Japanese Patent Kokai No. 52-42365). Limiting the subject mater to the method for providing a coating layer of silicon carbide on to the surface of carbon fibers, (5) a method is known in which a gaseous chlorine-containing silane compound such as silicon tetrachloride and trichlorosilane is pyrolyzed on the surface of carbon fibers to deposit elementary silicon followed by heating of the thus silicon-coated carbon fibers at a high temperature to effect the reaction between carbon and silicon into silicon carbide so that a filament having a sheath-and-core structure is obtained (see, for example, Japanese Patent Kokai No. 50-38700).

Unfortunately, each of the above described prior art methods is not quite satisfactory in one or other respects when industrial practice of the method is intended. To explain it, the first method is subject to the limitation of the kind of the substrate material because the method is performed at an extremely high temperature of 2000° C. or above so that the substrate material also naturally must withstand this high temperature. The second method has a problem, in addition to the considerably high temperature for the pyrolysis, that the starting chlorine-containing silane compound is readily hydrolyzed when in contact with atmospheric moisture requiring utmost carefulness in handling and the hydrogen chloride formed by the reaction as a byproduct is a hardly disposable material of nuisance sometimes to cause environmental pollution. The third method is, although it is advantageous in obtaining a coating layer of crystalline silicon carbide at a relatively low temperature, disadvantageous because of the great difference in the temperatures of pyrolysis and the reaction velocities between the silane and the hydrocarbon compound requiring delicate control of the concentrations of them or addition of hydrogen chloride to the reaction system since otherwise the resultant coating layer of silicon carbide has poor uniformity. The fourth method is also subject to the limitation of the applicable substrate materials due to the high reaction temperature of 1500° C. or higher. Further, the fifth method applied to carbon fibers is industrially unfeasible because of the complicacy of the process in addition to the high temperature conditions required for the reaction.

Thus, it would be a problem of great industrial importance to develop a novel and improved method for providing a coating layer of silicon carbide on to the surface of substrates including carbon fibers.

SUMMARY OF THE INVENTION

An object of the present invention is therefore to provide a novel and improved method for providing a coating layer of silicon carbide on to the surface of various kinds of substrate materials free from the above described problems in the prior art methods.

More particularly, the present invention has an object to provide a method for the preparation of a fiber material having a sheath-and-core structure formed of the core of carbon fiber and a peripheral coating layer of silicon carbide.

The method of the present invention for providing a coating layer of silicon carbide on to the surface of a substrate comprises pyrolyzing the vapor of a vaporizable organosilicon compound having at least one hydrogen atom directly bonded to the silicon atom in a molecule but having no halogen or oxygen atom directly bonded to the silicon atom at a temperature in the range from 700° to 1400° C. in contact with the surface of the substrate to deposit silicon carbide thereon.

DETAILED DESCRIPTION OF THE PREFERRED EMBODIMENTS

The substrate material on which the coating layer of silicon carbide is formed according to the inventive method is not particularly limitative provided that the material can withstand the temperature at which the starting organosilicon compound is pyrolyzed, i.e. a temperature in the range from 700° to 1400° C. Several of the substrate materials to which the inventive method is applicable include carbonaceous materials such as graphite and carbon fibers, elementary silicon such as semiconductor silicon in the form of a wafer, sapphire, ceramics such as sintered silicon nitride, alumina and the like, fuzed quartz glass, various kinds of metals and others. The carbon fibers are also not limitative in respect of the kind of the starting material from which the carbon fibers have been prepared including those obtained by the infusibilization and carbonization of polyacrylonitrile, rayon, pitch, lignin and other organic materials in a fibrous form as well as those obtained by the vapor phase pyrolysis of certain vaporizable organic compounds.

The starting vaporizable organosilicon compound to be pyrolyzed on the surface of the substrate in the inventive method is, as is described above, a vaporizable organosilicon compound having, in a molecule, at least one silicon-bonded hydrogen atom but no silicon-bonded oxygen or halogen atom. The organosilicon compound may be gaseous or liquid at room temperature so that it can readily be purified completely without particular problems by rectifying distillation under atmospheric or superatmospheric pressure relative to the heteroatoms other than silicon, carbon and hydrogen. Such an organosilicon compound is typically an organosilane or organopolysilane represented by the general formula $R_{2n+2}Si_n$, in which R is a hydrogen atom or a monovalent hydrocarbon group such as methyl, ethyl, propyl, phenyl and vinyl groups, at least one but not all of the groups denoted by R being a hydrogen atom, and n is a positive integer of 1 to 4 inclusive.

Alternatively, the organosilicon compound used as the material to be pyrolyzed in the inventive method may be a silhydrocarbylene compound represented by the general formula $R_3Si-R^1-SiR_2)_mR$, in which R is a hydrogen atom or a monovalent hydrocarbon group as defined above, $R^1$ is a methylene, an ethylene or a phenylene group and m is a positive integer of 1 or 2. It is optional that the organosilicon compound may have the polysilane linkage —Si—Si— and the silhydrocarbylene linkage —Si—$R^1$—Si— in the same molecule.

Several of the examples of the organosilicon compounds suitable as the material to be pyrolyzed in the inventive method are shown by the following structural formulas, in which the symbols Me, Et, Pr, Ph and Vi denote methyl, ethyl, propyl, phenyl and vinyl groups, respectively:

$MeSiH_3$; $Me_2SiH_2$; $Me_3SiH$; $Et_2SiH_2$; $PrSiH_3$; $ViMeSiH_2$; $PhSiH_3$; $H-SiMe_2-SiMe_2-H$; $Me-SiH_2-SiH_2-Me$; $H-SiMe_2-SiMe_2-SiMe_2-H$; $H-SiMe_2-CH_2-SiMe_2-H$; $Me-SiH_2-CH_2-CH_2-SiH_2-Me$; $H-SiMe_2-CH_2-SiMe_2-CH_2-SiMe_2-H$; $H-SiMe_2-CH_2-CH_2-SiMe_2-H$; $H-SiMe_2-C_6H_4-SiMe_2-H$; and $H-SiMe_2-CH_2-SiMe_2-SiMe_2-H$.

These compounds may be used either alone or as a mixture of two kinds or more according to need. Among the above named organosilicon compounds, preferred ones are methylsilane, dimethylsilane, 1,1,2,2-tetramethyldisilane and 1,1,2,2,3,3-hexamethyltrisilane due to the easiness in handling, the relatively high reaction velocity in comparison with the other organosilicon compounds and the inexpensiveness. In particular, a mixture of several dimethylpolysilanes having silicon-bonded hydrogen atoms obtained by the pyrolysis of a high-polymeric dimethylpolysilane expressed by the formula $-SiMe_2)_x$, in which x is a positive integer, at a temperature of 350° C. or higher is suitable as such without further separation into the individual components.

The method of the invention can be readily performed by passing the gaseous organosilicon compound or the vapor of the liquid organosilicon compound formed by evaporation under approximately atmospheric pressure through the reaction zone in which the substrate material is kept at a temperature suitable for the pyrolysis of the organosilicon compound. It is advantageous that the gas or vapor of the organosilicon compound is diluted with a suitable carrier gas such as hydrogen or an inert gas, e.g. nitrogen, argon, helium and the like or a mixture thereof, from the standpoint of adequately controlling the rate of silicon carbide deposition.

It is optional that the vaporizable and pyrolyzable organosilicon compound as named above is admixed with a pyrolyzable hydrocarbon compound to effect copyrolysis thereof with the organosilicon compound, especially, when the organosilicon compound contains a small amount of carbon relative to silicon although the mixing ratio of the hydrocarbon compound to the organosilicon compound should be limited. A too much amount of the hydrocarbon compound relative to the organosilicon compound naturally leads to the formation of free carbon in the coating layer of silicon carbide but there are cases in which a coating layer of silicon carbide containing free carbon is acceptable depending on the purpose. For example, the coating layer on carbon fibers may contain free carbon in an amount smaller than equimolar to the silicon carbide without particularly decreasing the effect of oxidation prevention and increasing the reactivity with molten metals. The hydrocarbon compound suitable for such a purpose is exemplified by those having a boiling point of 250° C. or below such as methane, ethane, propane, acetylene, benzene, toluene and the like.

As is mentioned before, the temperature at which the starting organosilicon compound is pyrolyzed should preferably be in the range from 700 to 1400° C. More preferably, the temperature should be in the range from 900 to 1300° C. This is because the velocity of pyrolysis of the organosilicon compound is too low at a temperature lower than 700° C. so that the efficiency of the method is greatly reduced while a temperature higher than 1400° C. is undesirable due to the decreased uniformity in the crystal growth of silicon carbide and the poor adhesion of the coating layer of the silicon carbide to the substrate surface to cause crack formation in the coating layer or eventual peeling of the coatng layer off the surface even though the velocity of pyrolysis can be as high as desired.

The thickness of the coating layer of silicon carbide formed on the substrate surface according to the inventive method can be freely controlled according to desire by suitably selecting various conditions such as the duration of the pyrolysis reaction, concentration of the organosilicon compound in the gaseous mixture with the carrier gas, reaction temperature and the like. When the layer of silicon carbide has a sufficiently large thickness, a possibility is obtained to prepare an unsupported film or plate of silicon carbide by dissolving away or melting down the substrate material supporting the silicon carbide layer.

Limiting the subject matter again to the process of providing a coating layer of silicon carbide on to the surface of carbon fibers, it is a convenient and efficient way that the inventive method of vapor-phase pyrolysis of the organosilicon compound directly succeeds the process of the carbonization treatment for the preparation of carbon fibers without taking the carbon fibers out of the carbonization furnace. The thickness of the silicon carbide coating layer on carbon fibers is also not particularly limitative but it is preferably in the range from 0.01 to 3 $\mu$m in order to achieve the above mentioned objects to impart the carbon fibers with increased resistance against oxidation and wettability or affinity with molten synthetic resins or metals. When the thickness of the coating layer is smaller than 0.01 $\mu$m, no substantial increase is obtained in the oxidation resistance of the carbon fibers while a too large thickness of the silicon carbide coating layer over 3 $\mu$m is undesirable due to the adverse influences on the mechanical properties of the carbon fibers.

Following are the examples to illustrate the method of the present invention in more detail but not to limit the scope of the present invention in any way.

EXAMPLE 1

A graphitic carbon plate with thoroughly cleaned surfaces was placed in a reaction tube of fused quartz glass and heated externally up to 980° C. A gaseous mixture composed of 95% by volume of hydrogen and 5% by volume of 1,1,2,2-tetramethyldisilane was passed through the tube kept at this temperature at a rate of 100 ml/minute for 30 minutes. The carbon plate taken out of the tube after cooling was found to be coated with a uniform layer formed of very fine crystallites of $\beta$-type silicon carbide firmly adhering to the surface. The thickness of this coating layer was about 5 $\mu$m.

The thus silicon carbide-coated carbon plate was heated repeatedly in air at 1300° C. to find no noticeable changes in the surface condition indicating that the coating layer was very strong and highly resistant against oxidation by air without pinholes.

For comparison, the same experimental procedure as above was repeated excepting that the temperature of the reaction tube containing the carbon plate was increased to 1450° C. It was found that the carbon plate taken out of the tube was also coated with a layer of silicon carbide but the size of the silicon carbide crystallites was non-uniform and relatively coarse indicating some ruggedness on the surface. Some cracks were also found in certain areas on the surface.

EXAMPLE 2

A plate of sapphire obtained by slicing a single crystal was placed in a reaction tube of fused quartz glass and heated at 1050° C. A gaseous mixture prepared by mixing equal volumes of argon gas and hydrogen gas containing 5% by volume of dimethylsilane vapor was introduced into the tube kept at the temperature at a rate of 100 ml/minute for 30 minutes to effect pyrolysis of the dimethylsilane. The sapphire plate taken out of the tube after cooling was found to be coated with a uniform layer of silicon carbide having a thickness of about 5 $\mu$m.

EXAMPLE 3

A tube of fused quartz glass was heated at 1120° C. and a gaseous mixture composed of 97% by volume of hydrogen and 3% by volume of the vapor of bis(dimethylsilyl) methane was introduced into the tube at a rate of 150 ml/minute for 30 minutes. The tube after cooling was found to be coated on the inner surface with a uniform layer having a thickness of about 7 $\mu$m formed of very fine crystallites of silicon carbide. When subjected to repeated cycles of heating and cooling between room temperature and 1000° C., the adhesion of the coating layer of silicon carbide to the quartz surface was very firm and stable so that no peeling thereof off the surface nor crack formation therein was noted at all.

EXAMPLE 4

A thin plate of elementary silicon was placed in a reaction tube of fused quartz glass and heated at 1030° C. and a gaseous mixture of 95% by volume of hydrogen and 5% by volume of vapor of 1,1,2,2-tetramethyldisilane and a gaseous mixture of 93% by volume of argon and 7% by volume of dimethylsilane were introduced into the tube at rates of 100 ml/minute and 50 ml/minute, respectively, for 60 minutes. The silicon plate taken out of the tube after cooling was found to be coated with a uniform layer of silicon carbide having a thickness of about 20 $\mu$m.

The thus silicon carbide-coated silicon plate was dipped in an acid mixture of hydrofluoric and nitric acids to remove the elementary silicon by dissolving away. A thin film of silicon carbide having a thickness of about 20 $\mu$m was obtained.

EXAMPLE 5

A reactor tube of fused quartz glass having an inner diameter of 50 mm and a length of 1000 mm was held horizontally in a tubular electric furnace and heated at 1030° C. with 0.213 g of polyacrylonitrile-based high-strength, long-filament carbon fibers (Torayca T-300A, a product by Toray Inc.) having an average filament diameter of 10 $\mu$m and a density of 1.75 g/cm$^3$ placed in the tube while the atmospheric air inside the tube had been replaced with nitrogen gas. Into the reactor tube thus kept at this temperature was introduced a gaseous mixture composed of 90% by volume of hydrogen and 10% by volume of dimethylsilane at a rate of 100 ml/minute for 30 minutes followed by switching of the flowing gas to hydrogen gas alone with the electric power to the furnace turned off to cool the tube to room temperature.

The fibers taken out of the reactor tube after cooling were black in color with somewhat decreased luster. Examination of the fibers by the electron microscopy and X-ray diffractometry indicated that the fibers had a sheath-and-core structure formed of the core of the carbon fiber and the peripheral layer having a thickness of about 0.4 μm formed crystallographically of the β-type silicon carbide. Measurement of the mechanical properties of the silicon carbide-coated carbon fibers gave a result that the tensile strength thereof was 263 kg/mm$^2$ and almost as strong as the carbon fibers without the coating layer having a tensile strength of 265 kg/mm$^2$ When heated in air at 800° C. for 24 hours, the tensile strength of the coated carbon fibers was decreased only very slightly to 258 kg/mm$^2$ indicating greatly improved resistance thereof against air oxidation at high temperatures.

EXAMPLE 6

The same apparatus as used in Example 5 was used and the reactor tube containing about 0.2 g of pitch-based high-modulus carbon filaments (KCF-200, a product by Kureha Chemical Co.) was heated at 980° C. A gaseous mixture composed of 95% by volume of hydrogen and 5% by volume of the vapor of 1,1,2,2-tetramethyldisilane was passed through the thus heated reactor tube at a rate of 100 ml/minute over a period of 40 minutes followed by switching of the flowing gas to hydrogen gas alone with the power to the furnace turned off to cool the tube down to room temperature.

The electron microscopy and X-ray diffractometry undertaken with the filaments taken out of the reactor tube indicated that the filaments had a sheath-and-core structure formed of the core of the carbon filament and the peripheral coating layer of 0.3 μm thickness, which was crystallographically formed of the β-type silicon carbide. The thus silicon carbide-coated carbon filament had a tensile strength of 210 kg/mm$^2$ which was about the same as the value 208 kg/mm$^2$ of the carbon filaments without the coating layer. The tensile strength of the coated carbon filaments decreased slightly to 198 kg/mm$^2$ by heating in air at 800° C. for 24 hours indicating greatly improved resistance against air oxidation at high temperatures.

The thus obtained silicon carbide-coated carbon filaments were dipped in a molten metallic aluminum at 680° C. for 30 minutes and, after cooling, the cross section thereof was examined by a scanning-type electron microscope to find no noticeable changes in the surface condition of the filaments indicating the complete inertness of the product in respect of the reactivity with molten metals.

For comparison, the same experimental procedure as above was repeated except that the temperature of the carbon filaments in the reactor tube was 680° C. instead of 980° C. The results were that almost no coating layer was formed on the surface of the carbon filaments even though the tensile strength thereof was remained unchanged. When heated at 800° C. in air, however, the carbon filaments were intensively oxidized to lose the fibrous form.

For further comparison, the same experimental procedure as above was again repeated except that the temperature of the carbon filaments in the reactor tube was increased to 1450° C. In this case, a coating layer of silicon carbide was formed on the surface of the carbon filaments but the tensile strength thereof was found to be greatly decreased to 130 kg/mm$^2$. Examination of the surface of the thus coated carbon filaments by electron microscopy indicated remarkable non-uniformity and ruggedness of the surface of the coating layer formed of silicon carbide.

EXAMPLE 7

The assembly of the electric furnace and the reactor tube was the same as in Example 5 and a sintered alumina plate having dimensions of 30 mm width×200 mm length×3 mm thickness, on which a small amount of a finely divided iron powder was spread and scattered as a seed catalyst, was placed inside the reactor tube. A gaseous mixture composed of 90% by volume of hydrogen gas and 10% by volume of benzene vapor was passed through the reactor tube heated at 1080° C. at a rate of 700 ml/minute for 60 minutes. It was found after cooling that carbon filaments had grown on the particles of the seed catalyst.

Without taking the thus formed carbon filaments out of the reactor tube, the temperature of the reactor tube was increased to 1210° C. and a gaseous mixture composed of 95% by volume of hydrogen gas and 5% by volume of dimethylsilane was introduced into the tube at a rate of 200 ml/minute for 60 minutes followed by switching of the flowing gas to hydrogen gas alone with the power to the furnace turned off to cool the tube down to room temperature. The fibrous material in the tube was taken out and the physical parameters thereof were examined to find that the average filament diameter was 14 μm and the average filament length was 10.5 cm and the filaments had a tensile strength of 248 kg/mm$^2$. X-ray diffractometric examination of this product indicated a sheath-and-core structure formed of a core of carbon coated with a peripheral layer of β-type silicon carbide having a thickness of about 0.1 μm.

The silicon carbide-coated carbon filaments thus obtained were very stable against air oxidation at high temperatures and retained a tensile strength of 242 kg/mm$^2$ even after heating in air at 800° C. for 24 hours, which value was about the same as that before the heating. Furthermore, the silicon carbide-coated carbon filaments were inert to molten aluminum and showed almost no noticeable changes even after dipping in a molten aluminum bath at 680° C. for 30 minutes.

EXAMPLE 8

The apparatus for experimentation was the same as in Example 5 and the reactor tube containing about 2.5 g of the same carbon fibers as in Example 5 was heated at 1170° C. A gaseous mixture composed of 90% by volume of hydrogen gas and each 5% by volume of methylsilane and methane was introduced into the tube at a rate of 200 ml/minute for 30 minutes followed by switching of the flowing gas to hydrogen gas alone with the power to the furnace turned off to cool the tube down to room temperature.

Electron microscopic and X-ray diffractometric examination of the carbon fibers taken out of the reactor tube indicated that the fibers had a sheath-and-core structure formed of the core of the carbon fiber and a peripheral coating layer of about 0.3 μm thickness composed of an about 2:1 by moles mixture of the β-type silicon carbide and carbon.

The thus coated carbon fibers had a tensile strength of 270 kg/mm$^2$, which value was about the same as that of those without coating (265 kg/mm$^2$). The coated fibers were remarkably resistant against air oxidation at high temperatures and retained a tensile strength of 262 kg/mm$^2$ even after heating in air at 800° C. for 24 hours.

For comparison, the composition of the gaseous mixture introduced into the reactor tube was modified by replacing the methylsilane and the methane each with the same volume of dimethylsilane and benzene vapor, respectively, the other experimental conditions being the same. In this case, the coating layer on the core carbon fibers formed by the vapor phase pyrolysis of the gaseous mixture was remarkably richer in the carbon content than in the above experiment as composed of an about 1:3.5 by moles mixture of the β-type silicon carbide and carbon. The thus obtained carbon fibers coated with a carbon-rich coating layer were less resistant against air oxidation at high temperatures and heating of them in air at 800° C. for 24 hours resulted in degradation of them to a great extent by oxidation leaving almost no measurable tensile strength even though the fibrous form thereof was barely retained. They were also very reactive with molten aluminum and dipping of them in a molten aluminum bath resulted in complete loss of their fibrous form by the reaction with the molten aluminum.

What is claimed is:

1. A method for providing a coating layer of silicon carbide on the surface of a filament of carbon in a sheath-and-core manner which comprises pyrolyzing the vapor of a vaporizable organosilicon compound having at least one hydrogen atom directly bonded to the silicon atom in a molecule but having no halogen atom or oxygen atom directly bonded to the silicon atom at a temperature in the range from 700° to 1400° C. in contact with the surface of the carbon filament to deposit silicon carbide thereon, wherein the organosilicon compound is a silane or polysilane compound represented by the general formula $R_{2n+2}Si_n$, in which R is a hydrogen atom or a monovalent hydrocarbon group, at least one but not all of the groups denoted by R in a molecule being a hydrogen atom, and n is a positive integer of 1 to 4 inclusive.

2. The method as claimed in claim 1 wherein the temperature at which pyrolysis of the organosilicon compound is performed is in the range from 900° to 1200° C.

3. The method as claimed in claim 1 wherein the vapor of the organosilicon compound is admixed with the vapor of a hydrocarbon compound in such an amount that the product of the pyrolysis of the mixed vapor is composed of silicon carbide and carbon, the amount of carbon being not exceeding equimolar to that of the silicon carbide.

* * * * *